Figure 1:
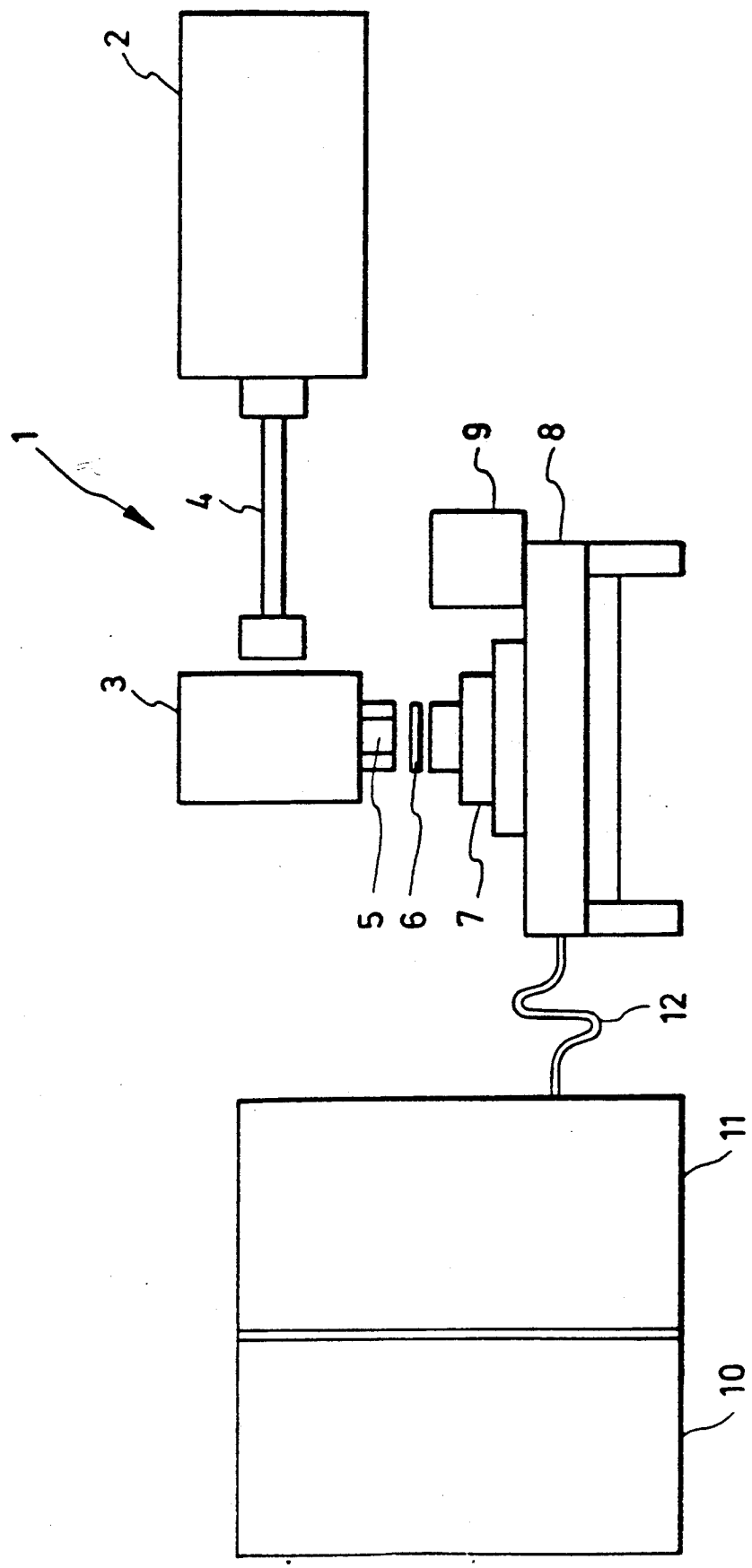

United States Patent [19]
Vogt et al.

[11] Patent Number: 5,296,891
[45] Date of Patent: Mar. 22, 1994

[54] ILLUMINATION DEVICE

[75] Inventors: Holger Vogt, Mülheim; Heinz Kück, Duisburg; Günther Hess, Duisburg; Andreas Gehner, Duisburg, all of Fed. Rep. of Germany

[73] Assignee: Fraunhofer-Gesellschaft zur Förderung der angewandten Forschung e.V., Munich, Fed. Rep. of Germany

[21] Appl. No.: 940,958

[22] PCT Filed: May 2, 1991

[86] PCT No.: PCT/DE91/00375
§ 371 Date: Oct. 29, 1992
§ 102(e) Date: Oct. 29, 1992

[87] PCT Pub. No.: WO91/17483
PCT Pub. Date: Nov. 14, 1991

[30] Foreign Application Priority Data

May 2, 1990 [DE] Fed. Rep. of Germany ....... 4014131

[51] Int. Cl.$^5$ ............................................. G03B 27/54
[52] U.S. Cl. ................... 355/67; 346/107 R; 355/53
[58] Field of Search ............... 355/53, 67, 71; 353/122; 346/107 R

[56] References Cited

U.S. PATENT DOCUMENTS

| | | | |
|---|---|---|---|
| 4,675,702 | 6/1987 | Gerber | 346/107 |
| 4,728,185 | 3/1988 | Thomas | 353/122 |
| 4,970,546 | 11/1990 | Suzuki et al. | 355/53 |
| 5,097,291 | 3/1992 | Suzuki et al. | 355/69 |
| 5,191,374 | 3/1993 | Hazama et al. | 355/534 |

FOREIGN PATENT DOCUMENTS 0358467 3/1990 European Pat. Off. .

OTHER PUBLICATIONS

Brinker, W. et al, "Deformation behavior of thin viscoelastic layers ...", SPIE vol. 1018 Electro-Optic and Magneto-Optic Materials, 1988.
International Search Report for PCT/DE91/00375, Sep. 2, 1991.

Primary Examiner—Richard A. Wintercorn
Attorney, Agent, or Firm—Wolf, Greenfield & Sacks

[57] ABSTRACT

The illumination device (1) proposed is designed to produce models (6), or for the direct illumination of electronic elements, and includes a light source (2) and a pattern generator (3).

In order to shorten the necessary writing time or exposure time with a simplified illumination-device structure, the pattern generator (3) includes an optical schlieren system (15, 17) and an active, matrix-addressable surface light generator (13) which has a viscoelastic control layer with a reflective surface (19). Disposed between the schlieren lens (15) and the projection lens (16) in the schlieren system (14) is a mirror device (17) which preferably has two functions, not only deflecting the light from the light source (2) to the surface light modulator (13) but also filtering out undiffracted reflected light. The schlieren lens is located at a distance from the surface light modulator (13) which is short relative to the focal length of the lens. A positioning table (7) designed to hold the model (6), or the electronic element is disposed in such a way that sharp images of surface areas (19a, 19b) of the surface light modulator (13) can be produced on the model or the electronic element.

16 Claims, 3 Drawing Sheets

ILLUMINATION DEVICE

The present invention refers to an illumination device or exposure device for producing models, such as reticles and masks, used for manufacturing electronic elements, or for direct illumination of wafers and substrates during the photolithographic steps required for production, or for direct illumination of structures including light-sensitive layers, said illumination or exposure device comprising a light source and a pattern generator.

The present invention especially deals with the production of models, reticles and masks, or with direct illumination in the micrometer range in the fields of semiconductor production, the production of integrated circuits, hybrid production and the production of flat screens as well as similar production methods in the case of which illumination processes are used. The present invention especially concerns an illumination device, which is adapted to be used for direct illumination of semiconductor wafers in the field of semiconductor production and for direct illumination of substrates in the field of hybrid and bonding technology.

For the production of reticles, which are illumination templates for the photolithographic production of circuits, as well as for the production of masks and for direct illumination of semiconductor products, electron beam writers, laser beam units and optical pattern generators including a laser light source or a mercury-vapour lamp are used. Optical pattern generators according to the prior art produce the desired structures by carrying out successive, individual illuminations of rectangular windows, which are defined by mechanical rectangular shields. The complexity of the structure to be produced determines the number of illumination rectangles required, and said number, in turn, determines the writing time or the exposure time for the structure. The accuracy of the structures which can be produced by these known pattern generators is, in turn, limited by the accuracy of the mechanical rectangular shields used.

In the case of laser beam units according to the prior art, the surface to be illuminated is rastered by a laser beam. The writing speed or illumination speed of such laser beam units is limited due to the serial data flow required for the rastering process. In addition, such laser beam units necessitate high mechanical-optical investments.

The electron beam units employed in the prior art can only be used for the illumination of electron-sensitive, special photoresist systems, and, in comparison with the above-described laser beam units, they additionally require the use of a high-vacuum technique. It follows that electron beam units necessitate very high capital expenditure and operating costs.

The technical publication B. W. Brinker et al, "Deformation behavior of thin viscoelastic layers used in an active, matrix-addressed spatial light modulator", Proceeding of SPIE 1989, vol. 1018, already discloses the use of a reflective optical schlieren system including an active, matrix-addressed, viscoelastic surface light modulator for the purpose of producing television pictures or for the purpose of image display. This surface light modulator includes a permanent light source whose light falls vertically onto the surface of the surface light modulator through an appropriate optical system. Surface areas of the surface light modulator are adapted to be deformed in response to addressing of control electrodes so that the light falling onto the surface will be reflected as diffracted light in the case of addressed surface elements and as undiffracted light in the case of non-addressed surface elements. The undiffracted light will be returned to the light source, whereas the diffracted light will be used via the optical schlieren system for image production on the television screen or on an image display area.

The company publication of the firm of Texas Instruments, JMF 008:0260; 10/87, discloses a surface light modulator whose reflective surface consists of a plurality of electrically addressable, mechanically deformable reeds.

U.S. Pat. No. 4,675,702 discloses a photoplotter or generally an illumination device serving for directly illuminating light-sensitive layers during the photolithographic production of integrated circuits. In this photoplotter, the illumination of predetermined areas under the control of a computer is established by arranging a device formed as a light valve comprising individually controllable valve sections between a source for parallel light and the light sensitive layer to be illuminated. As far as the light valve is concerned, it is disclosed that the same should work like a negative and therefore should serve to switch the addressable areas by an electronic control in a condition preventing the passing-through of the light such that corresponding areas of the light sensitive layer remain in their non-illuminated condition.

In comparison with this prior art, the present invention is based on the task of further developing an illumination device of the type mentioned at the beginning in such a way that, on the basis of a simple and economy-priced structure of the illumination device, an exposure time or writing time is achieved, which is reduced in comparison with the exposure time or writing time of illumination devices in the form of laser beam systems or electron beam systems.

In the case of an illumination device according to the generic clause of patent claim 1, this task is solved by the features disclosed in the characterizing clause of patent claim 1.

According to the present invention, the pattern generator is formed by an optical schlieren system and an active, matrix-addressable surface light modulator, said surface light modulator, which can also be called two-dimensional light modulator, being provided with a reflective surface whose addressed surface areas reflect incident light as diffracted light and whose non-addressed surface areas reflect incident light as undiffracted light. The schlieren system comprises a schlieren lens arranged on the side of the surface light modulator and a projection lens facing away from the surface light modulator as well as a mirror device which is arranged between these lenses and which directs light coming from the light source onto the surface of the surface light modulator. A focussing means focusses the light coming from the light source onto the mirror device. The schlieren lens is arranged at a distance from the surface light modulator which is short relative to the focal length of the lens. A filter device is arranged between the schlieren lens and the projection lens, said filter device being provided with a structural design of such a nature that it will filter out the undiffracted light reflected by the non-addressed surface areas of the surface light modulator and that it will only permit the diffracted light, which is reflected by the addressed surface areas, to pass via the projection lens to the model, or to the electronic element, or to the structure. The model, or the electronic element, or the structure can be secured in position on a positioning table in such a way that a sharp image of the addressed surface areas of the surface light modulator can be formed on the model, or on the electronic element, or on the structure. Preferably, the mirror device is arranged at a distance from the schlieren lens which corresponds to the focal length of said schlieren lens, so that said mirror device can fulfill a double function, viz., on the one hand, the function of deflecting the light coming from the light source to the surface light modulator, and, on the other hand, the function of acting as a filter device for reflected zeroth-order light by reflecting this undiffracted light back to the light source.

According to an essential aspect of the present invention, the light source of the illumination device according to the invention is a pulsed laser light source whose pulse duration is shorter than the minimum dimension of the structure to be produced divided by the displacement rate of the positioning table. On the basis of this embodiment, the illumination device according to the present invention permits a stroboscopelike illumination of the model, or of the electronic element, or of the structure during an essentially continuous displacement of the positioning table, whereby very high writing speeds and exposure speeds are achieved.

In spite of the high illumination intensity of the individual laser light pulses, the present invention makes use of a surface light modulator of a type employed in the prior art only for cases of use in which the illumination intensity is very low, this being e.g. the case with television screens. However, in view of the fact that the laser light pulses of the illumination device according to the present invention are only pulses of short duration, the surface light modulator will still meet the thermal requirements. On the basis of the rapid programmability or addressability of the surface light modulator, said surface light modulator can be reprogrammed or readdressed during the displacement movement of the positioning table between two successive partial images of an overall structure to be produced. This will not only permit a short exposure pulse sequence in the case of direct illumination of semiconductor wafers with repetitive structures, but it will also permit the production of irregular structures on the basis of the rapid reprogrammability of the surface light modulator.

Further development of the illumination device according to the present invention are disclosed in the subclaims.

Figure 2:
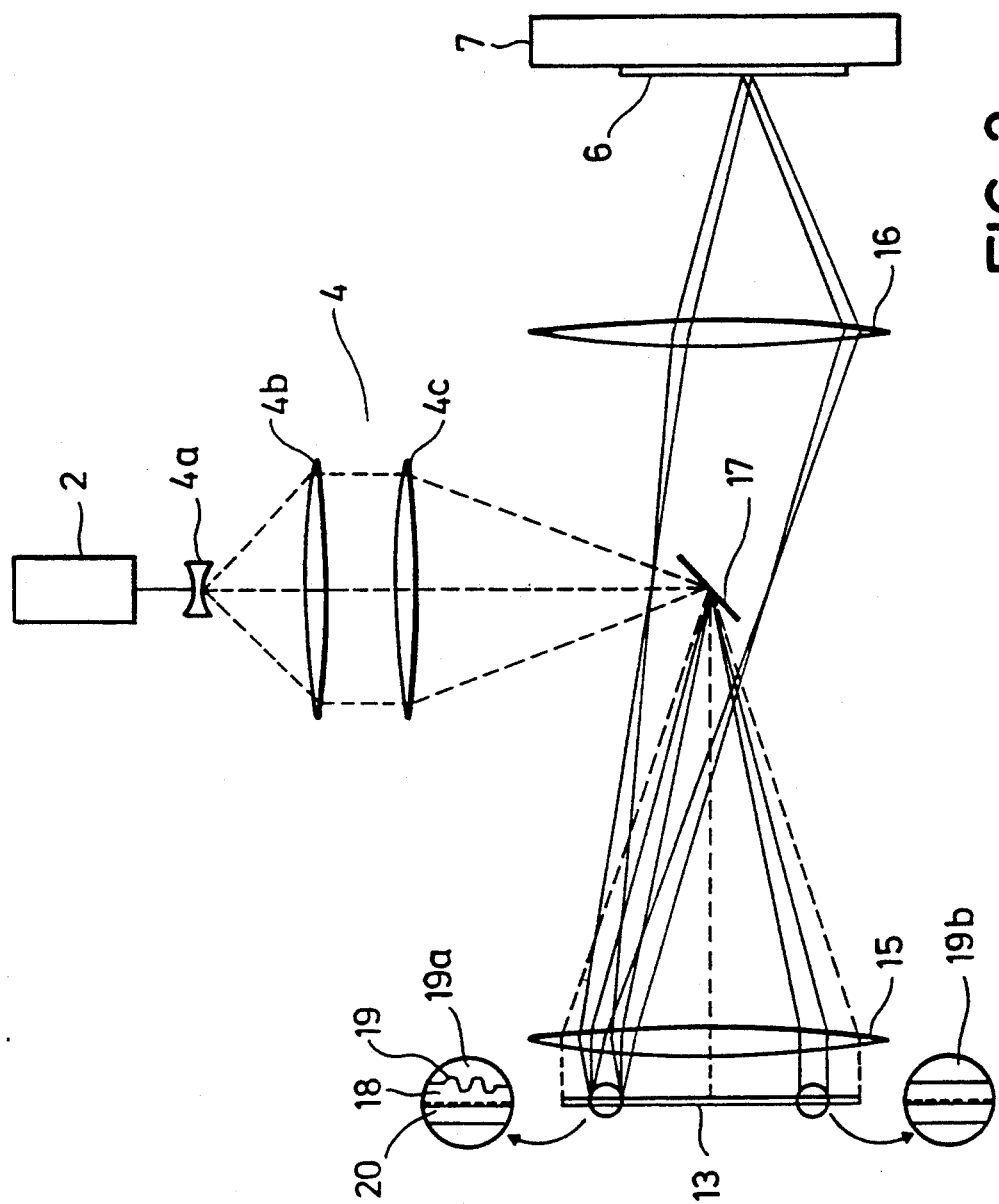
Figure 3:
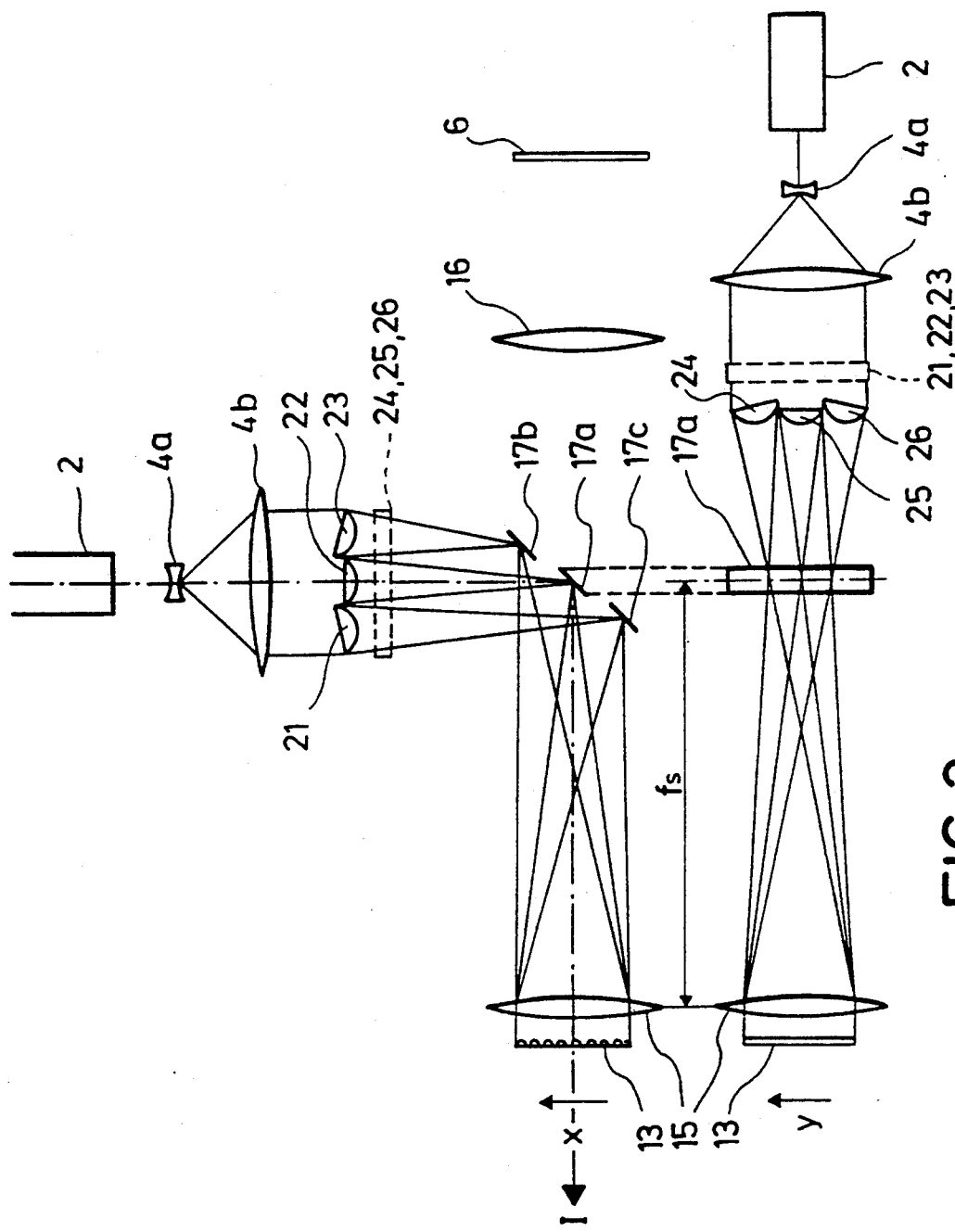

In the following, a preferred embodiment of the illumination device according to the present invention will be explained in detail with reference to the drawings enclosed, in which:

FIG. 1 shows a schematic representation of the total structure of the illumination device according to the present invention;

FIG. 2 shows a detailed representation of a pattern generator, an optical schlieren system and a positioning table of the illumination device according to the present invention; and FIG. 3 shows a detailed representation of a pattern generator, of an embodiment of the optical schlieren system which has been modified in comparison with the embodiment according to FIG. 2, and of the positioning table of the illumination device according to the present invention.

The illumination device shown in FIG. 1 is provided with reference numeral "1" in its entirety and serves to produce models, such as reticles and masks for the production of electronic elements, or to effect direct illumination of substrates or of structures with light-sensitive layers. The illumination device 1 according to the present invention includes an excimer laser light source 2. This excimer laser light source is a gas discharge laser device with wavelengths in the ultraviolet region of approx. 450 to 150 nm, which emits in a controllable manner light pulses with a very high light intensity per pulse and with a high repetition rate. The excimer laser light source 2 is connected to an pattern generator 3 via an illuminating optical unit 4. The illuminating optical unit 4 serves to supply the light coming from the excimer laser light source 2 to a surface light modulator 13, which forms part of the pattern generator 3 and which will be explained hereinbelow, in such a way that the light aperture of the excimer laser light source 2 will be adapted to the surface of the surface light modulator. In the case of preferred embodiments, which will be explained hereinbelow with respect to FIG. 2 and 3, the illuminating optical unit 4 is defined by lens systems whose structure is known per se.

By means of a projecting optical unit 5, the pattern generator forms an image of an pattern on a model 6 in a manner which will be described in detail hereinbelow, said model 6 being held by an x-y-Θ positioning table.

The projecting optical unit 5 does not only serve to form on the model 6 an image of the pattern produced by the pattern generator 3, but it also serves to carry out a desired magnification or demagnification upon forming the image and, as far as this is desired, to autofocus the image on the model 6.

As has already been explained, the model can, for example, be reticles or masks. In the case of direct illumination, which has been explained at the beginning as well, the x-y-Θ positioning table 7 carries, instead of the model 6, a semiconductor wafer to be illuminated, some other element which is to be produced by means of photolithography, or a structure with a light-sensitive layer which is to be written on or which is to be illuminated.

The positioning table 7 is arranged on a vibration-isolating support structure 8. This support structure 8 can have provided thereon a loading and unloading station 9 for additional models 6 or semiconductor elements, or for structures to be illuminated. The loading and unloading station 9 can be provided with a structural design which is normally used in the field of semiconductor production technology and which is suitable for automatically charging the positioning table 7 with the models or substrates to be illuminated or with other semiconductor elements.

A control computer 10 and the associated control electronics 11 carry out all control functions for the exposure device. The control computer 10 and the control electronics 11 especially communicate with the positioning table 7 for the purpose of computer-controlled position adjustment of the positioning table. The control computer 10 programmes and addresses, respectively, the pattern generator 3 in response to the respective control position of the positioning table 7 for successively producing partial images on the model 6 from which the exposed overall structure will result. A magnetic tape unit or an LAN interface (not shown) is used as a data carrier.

As can be seen in FIG. 2, the pattern generator 3 includes a surface light modulator or two-dimensional light modulator 13 as well as an optical schlieren system comprising a schlieren lens 15, which faces the surface light modulator 13, a projection lens 16, which faces away from the surface light modulator 13, and a mirror device 17, which is arranged between the schlieren lens 15 and the projection lens 16.

Relative to its focal length, the schlieren lens 15 is arranged at a short distance from the surface light modulator 13.

The mirror device 17 is positioned in the focal plane of the schlieren lens as well as in the optical axis thereof. A beam expansion optical system 4a, 4b and a focussing optical system 4c, which serve to focus the light emitted by the excimer laser light source 2 onto the mirror device 17 and which are components of the illuminating optical unit 4, are positioned between the excimer laser light source and the mirror device 17.

The surface light modulator 13 comprises a viscoelastic control layer 18, which is sealed by a reflective surface 19 towards the schlieren lens 15, said reflective surface being formed e.g. by a metal film. Furthermore, the surface light modulator 13 includes a so-called active addressing matrix 20, which can consist of a monolithic integrated array of MOS transistors with associated pairs of control electrodes. Typically, the addressing matrix 20 will comprise 2000×2000 pixels. Each pixel or surface area 19a, 19b, ... of the reflective surface 19 of the addressing matrix 20 has associated therewith two transistors with one or several pairs of electrodes forming each a diffraction grating with one or several grating periods with the vicoelastic layer 18 and its reflective surface 19.

When a surface area 19a, 19b, ... is addressed by applying opposed voltages to the two electrodes of a pair of electrodes of the respective surface area (logical "1"), the reflective surface 19 will assume a form having an approximately sinusoidal cross-section. If not addressed, the respective surface area 19a, 19b, ... will be flat. When a light beam falls on a non-addressed surface area 19a, 19b, ..., it will be reflected and returned to the light source via a mirror of the mirror device 17. It follows that the mirror device 17, which is arranged in the focal plane of the schlieren lens 15, serves, on the one hand, to deflect the light which comes from the light source 2 towards the surface light modulator 13 and, on the other hand, it serves as a filter device for filtering out light components which are reflected without being diffracted by the non-addressed surface areas 19a, 19b, ....

To the person skilled in the art it will be obvious that, deviating from the embodiment shown, it is possible to separate the two functions light introduction and filtering by making use of two separate components. In this case, the mirror device 17 will have to be arranged such that, relative to the focal plane of the schlieren lens 15, it is displaced towards said schlieren lens along the optical axis. In this connection, it is possible to use a partly reflecting mirror. The diffraction plane will, accordingly, be displaced into the opposite direction so that, for filtering out zeroth-order diffraction light, it will additionally be necessary to insert a shutter into the beam path, and this shutter will have to be arranged such that, relative to the focal plane of the schlieren lens 15, it is displaced in the direction of the projection lens 16. When the respective area is addressed, the incident light will be diffracted so that higher orders of diffraction will pass the mirror device 17, which acts as a shutter, and so that a sharp image of said higher orders of diffraction can be formed on the model 6 with the aid of the projection lens 16. In this way, only addressed surface areas 19a, 19b, ..., will be projected so that the image produced at the location of the model 6 will correspond to the programmed logic state of the surface light modulator 13.

In the case of the illumination device according to the present invention, up to 90% of the laser intensity falling on the reflective surface 19 can contribute to image production.

In the case of the embodiment according to FIG. 2, a single point light source, with the aid of which the surface light modulator 13 is illuminated, is produced at the location of the mirror device by focussing the light which comes from the excimer laser light source 2 onto said mirror device 17.

In the case of the second embodiment of the illumination device according to the present invention, which will be described hereinbelow with respect to FIG. 3, the single point light source produced in the focal plane according to the first embodiment is replaced by a plurality of substantially point-symmetric point light sources, which are essentially arranged in the focal plane and each of which illuminates the whole surface of the surface light modulator 13.

In the description of the second embodiment according to FIG. 3 following hereinbelow, parts corresponding to the embodiment according to FIG. 2 will be provided with the same reference numerals so that a renewed description of these system components can be dispensed with.

Deviating from the embodiment according to FIG. 2, the embodiment of the illumination device according to the present invention shown in FIG. 3 includes not only a single mirror device 17, but a bar-type mirror arrangement 17a, 17b, 17c, which, in the case of the embodiment shown in the present connection, is provided with three bar-type mirrors. It is, however, just as well possible to use bar-type mirror arrangements including a higher number of bar-type mirrors.

The central bar-type mirror 17a is positioned at the focus of the schlieren lens 15. The two additional bar-type mirrors 17b, 17c are arranged such that the light coming from the laser light source 2 and deflected by one of said bar-type mirrors 17b, 17c towards the surface light modulator will fall on the other bar-type mirror 17c, 17b in the case of undiffracted reflection by the non-addressed surface areas 19a, 19b, ... of the surface light modulator 13 and will be returned by said other bar-type mirror 17c, 17b in the direction of the laser light source 2. In other words, the bar-type mirrors are respectively arranged in pairs in such a way that the point light sources produced on a bar-type mirror by the focussing described hereinbelow will illuminate the whole surface of the surface light modulator 13 such that, in the case of undiffracted reflection of the light of these point light sources, the reflected light will fall on the respective other bar-type mirror, which, consequently, serves as a filter for said first-mentioned bar-type mirror.

The upper representation of FIG. 3 shows the illumination device in the x-z plane, whereas the lower representation shows the illumination device in the y-z plane along the sectional line II of the upper representation.

The respective directions of the axes of the bar-type mirrors 17a, 17b, 17c extend in the y-direction and, consequently, parallel to the phase structure produced by the waviness of the surface 19 of the surface light modulator 13.

In order to produce point light sources at the location of the bar-type mirrors 17a, 17b, 17c, the illuminating optical unit 4 comprises, in addition to the beam expansion optical system 4a, 4b, a cylindrical lens system 21, 22, 23 for each bar-type mirror, said cylindrical lens system being oriented parallel to the phase structure, i.e. in the y direction. As can be seen from FIG. 3, these cylindrical lens systems have different focal lengths for focussing onto the bar-type mirrors 17a, 17b, 17c arranged at different distances therefrom. Furthermore, the cylindrical lens systems 21, 23 arranged outside of the optical axis include prisms, which will cause the light to fall on the respective bar-type mirrors 17b, 17c at such an angle that the surface light modulator 13 will in each case be illuminated throughout its whole surface. In the optical path behind the cylindrical lens system 21, 22, 23 arranged parallel to the phase structure, a cylindrical lens system 24, 25, 26 is provided, which is disposed perpendicularly to the phase structure and the structural design and arrangement of which corresponds to that of the cylindrical lens system just described. The cylindrical lens systems, which are placed one behind the other, produce nine point light sources on the three bar-type mirrors 17a, 17b, 17c in the case of the embodiment shown.

During operation, the positioning table 7 is continuously moved in a predetermined, direction of movement, and in the course of this movement an image of overlapping partial images of the whole structure to be imaged will be formed on the model 6 by pulsing the excimer laser light source 2. The addressing matrix 20 will normally comprise a plurality of pixels which are not capable of functioning and which are the result of fabrication defects so that these pixels cannot, or not completely be switched to the logic states "1" and "0", respectively. These defects of the matrix 20 are compensated by locating all defective pixels and rendering them ineffective by applying a logical "0". The fact that each structure on the model 6 is produced by overlapping partial images guarantees that each part of the structure to be illuminated will be illuminated at least once by a pixel in working order or by a surface area in working order.

The production of the whole illuminated structure during continuous displacement of the positioning table 7 will not result in unsharpness, since the pulse duration of the pulsed excimer laser light source 2 is shorter than the minimum dimension of the structure to be produced divided by the displacement rate of the positioning table 7.

The data structure for controlling the addressing matrix 20 corresponds essentially to the data structure for controlling raster-orientated laser beam or electron beam units according to the prior art. An essential advantage resulting from the use of the illumination device according to the present invention is to be seen in the fact that the time required for transmitting large volumes of data can be reduced to an almost arbitrary extent on the basis of the subdivision of the addressing matrix 20 and on the basis of parallel programming of submatrixes of e.g. 16 or 32 strips. An additional advantage of the illumination device 1 according to the present invention, which includes the addressing matrix 20, is to be seen in the fact that, for the purpose of illuminating repetitive structures, such as regular arrays of integrated circuits on a silicon wafer, the addressing matrix 20 will have to be programmed only once and the programmed image will have to be stored only once for all identical structures.

It is possible to provide the illumination device according to the present invention with an autocalibration in the case of direct writing. For this purpose, reference marks are provided on the positioning table 7 and on the model 6, and the addressing matrix 20 is used as a programmable reference mark. By means of autocalibration, magnification errors of the projecting optical unit 5 as well as all positioning errors can be compensated.

We claim:

1. An illumination device for producing models used for manufacturing electronic elements, or for direct illumination of wafers or substrates during the photolithographic steeps required for their production, or for direct illumination of structures including light-sensitive layers, comprising:

a pulsed laser light source;

a pattern generator;

said pattern generator including an optical Schlieren system and an active, matrix-addressable surface light modulator;

said surface light modulator including a reflective surface having addressed surface areas which diffract incident light and non-addressed surface areas which reflect incident light;

said Schlieren system comprising a Schlieren lens arranged on a side of said surface light modulator, a projection lens facing away from said surface light modulator, and a mirror device arranged between said lenses for directing light coming from said light source onto said reflective surface on said surface light modulator;

means for focussing the light coming from said light source onto said mirror device;

wherein said Schlieren lens is arranged from said surface light modulator at a short distance relative to the focal length of said Schlieren lens;

a filter device arranged between said Schlieren lens and said projection leans, said filter device having a structural design to filter out undiffracted light reflected by said non-addressed surface areas of said surface light modulator and to permit diffracted light reflected by said addressed surface areas to pass via said projection lens to the model, or to the electronic element, or to the structure;

a displaceable positioning table for securing the model, or the electronic element, or the structure so that a sharp image of said addressed surface areas of said surface light modulator is formed on the model, or on the electronic element, or on the structure;

said pulse laser light source having a pulse duration shorter than the minimum structural dimension of the model to be produced, or of the electronic element, or of the structure divided by the displacement rate of said positioning table; and during the displacement of the positioning table, the model, or the electronic element, or the structure is put together using a plurality of successive partial images by adequate addressing of said surface light modulator.

2. An illumination device according to claim 1, wherein said mirror device is arranged at a distance from said Schlieren lens corresponding to the focal length of said Schlieren lens, and said mirror device is said filter device in that it returns the undiffracted light reflected by said non-addressed surface areas to said light source.

3. An illumination device according to claim 1, wherein said mirror device is arranged at a distance from said Schlieren lens which is shorter than the focal length of said Schlieren lens, and said filter device forms a shutter for undiffracted light reflected by said non-addressed surface areas, said shutter being arranged at a distance from said Schlieren lens greater than the focal length of said Schlieren lens.

4. An illumination device according to claim 1, wherein said mirror device includes a bar-type mirror having a longitudinal axis (y) which extends parallel to a phase structure produced by the waviness of said reflective surface of said surface light modulator.

5. An illumination device according to claim 4, wherein said mirror device includes a plurality of bar-type mirrors, one of said bar-type mirrors being arranged at the focus of said Schlieren lens, and two additional bar-type mirrors are arranged such that the light coming from said light source and deflected by one of said bar-type mirrors towards said surface light modulator will fall on said other bar-type mirror in the case of undiffracted reflection by said non-addressed surface areas of said surface light modulator.

6. An illumination device according to claim 5, comprising:
   a beam expansion optical system which transforms the light coming from said light source into a broad, essentially parallel bundle of light,
   a first cylindrical lens system oriented in the direction of the phase structure and including a number of cylindrical lenses corresponding to the number of bar-type mirrors; and
   a second cylindrical lens system arranged perpendicular to said first cylindrical lens system.

7. An illumination device according to claim 1, wherein said pulsed laser light source is an excimer laser light source.

8. An illumination device according to claim 1, wherein said surface light modulator and said positioning table are controlled such that each pixel of the model, or of the element, or of the structure to be illuminated is illuminated at least twice with partially overlapping images so that the displacement of the imaged pixel corresponds to the distance by which said positioning table has been displaced between the pulses for producing the images.

9. An illumination device according to claim 1, wherein, upon carrying out matrix addressing of said surface light modulator, said surface areas which have been recognized as being incapable of functioning are not addressed.

10. An illumination device according to claim 1, wherein each surface area of said surface light modulator has associated therewith two transistors each provided with one electrodes, which, in response to addressing of the respective surface area, will each produce at least one diffraction grating with said reflective surface arranged on a viscoelastic control layer covering said transistors.

11. An illumination device according to claim 1, comprising an automatic loading and unloading device for wafers or substrates, which permits fully automatic illumination of a batch of wafers or substrates.

12. An illumination device according to claim 1, comprising a preadjustment means and a fine adjustment means permitting accurate, repeated illuminations of the substrates during the production process.

13. An illumination device according to claim 12, wherein said surface light modulator is used as a programmable reference mark during preadjustment and fine adjustment.

14. An illumination device according to claim 1, wherein said surface light modulator has a viscoelastic control layer with said reflective surface arranged thereon.

15. An illumination device according to claim 14, wherein said reflective surface of the surface light modulator is covered with a liquid-crystal layer, and said electrically addressable surface areas cause a phase displacement and, consequently, a diffraction of the incident light.

16. An illumination device according to claim 1, wherein said surface light modulator has a reflective surface including addressable mechanical reeds, wherein bending of said reeds will cause a phase displacement and, consequently, a diffraction of the light.

* * * * *